United States Patent
Sakura

Patent Number: 5,869,365
Date of Patent: Feb. 9, 1999

[54] METHOD OF FORMING T ELECTRODE IN FIELD EFFECT TRANSISTOR

[75] Inventor: Naoki Sakura, Tokyo, Japan

[73] Assignee: NEC Corporation, Tokyo, Japan

[21] Appl. No.: 942,821

[22] Filed: Oct. 2, 1997

[30] Foreign Application Priority Data

Oct. 3, 1996 [JP] Japan ................... 8-263325

[51] Int. Cl.$^6$ .......... H01L 21/338; H01L 21/28; H01L 21/44
[52] U.S. Cl. ............ 438/182; 438/579; 438/952
[58] Field of Search ............ 438/182, 574, 438/579, 180, 181, 184, 185, 173, 952

[56] References Cited

U.S. PATENT DOCUMENTS

| | | |
|---|---|---|
| 5,302,538 | 4/1994 | Ishikawa et al. . |
| 5,496,748 | 3/1996 | Hattori et al. . |
| 5,656,128 | 8/1997 | Hashimoto et al. . |

FOREIGN PATENT DOCUMENTS

| | | |
|---|---|---|
| 63-245961 | 10/1988 | Japan . |
| 6-204130 | 7/1994 | Japan . |

OTHER PUBLICATIONS

Wolf, S. and Tauber, R.N., Silicon Processing for the VLSI Era, Wol. 1, Sunset Beach, California, pp. 156–158, 427–428,518–582,1986.

Ohno, Terukazu, "A high Performance Ultra–Thin Quarter–Micron CMOS/SIMOX Technology", NTT LSI Laboratories, 3B–1, 3–1, Morinosato Wakamiya, Atsugi–shi, Kanagawa, 243–01, Japan, pp. 25–26.

Woerlee, P.H., "A Half–Micron CMOS Technology Using Ultra–Thin Silicon on Insulator", IEEE, IEDM 90–583, Philips Research Laboratories, The Netherlands, 1990, pp. 52.1.4.

Primary Examiner—Richard A. Booth
Assistant Examiner—Josetta Jones
Attorney, Agent, or Firm—Foley, Hoag & Eliot LLP

[57] ABSTRACT

In a method of manufacturing a semiconductor device, an operating layer and a light-shielding film are sequentially formed to form a recess step on a semiconductor substrate. A first photoresist film is formed on the light-shielding film. The light-shielding film is patterned using the photoresist film as a mask to form a gate electrode formation opening portion. A metal film is formed on the entire surface including the opening portion. The metal film is selectively etched using, as a mask, a second photoresist film formed on the metal film, thereby forming a gate electrode having a T shape in the longitudinal section. The second photoresist film is removed. The light-shielding film is removed.

20 Claims, 6 Drawing Sheets

METHOD OF FORMING T ELECTRODE IN FIELD EFFECT TRANSISTOR

BACKGROUND OF THE INVENTION

1. Field of the Invention

The present invention relates to a method of manufacturing a semiconductor device and, more particularly, to a method of forming a T electrode in a field effect transistor.

2. Description of the Prior Art

With high integration of semiconductor devices, micropatterning of gate electrodes has been advanced. However, micropatterning of gate electrodes inevitably leads to an increase in gate resistance. As a measure against this, a method of forming a T gate electrode is employed. FIGS. 1A to 1E are sectional views, respectively, showing a semiconductor chip to explain the steps in manufacturing the T gate electrode of a conventional GaAs FET.

Figure 1A:
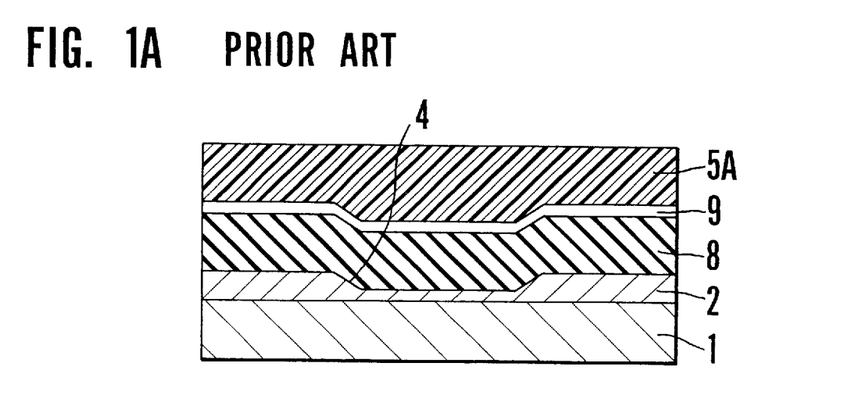
FIGS. 1A to 1E are sectional views, respectively, showing the steps in a conventional method of manufacturing a semiconductor chip.

As shown in FIG. 1A, after an operating layer 2 is formed on a semi-insulating substrate 1, part of the surface of the operating layer 2 is selectively removed by wet etching or dry etching using a photoresist pattern as a mask, thereby forming a recess step 4. An insulating film 8 made from $SiO_2$ is formed by LP-CVD on the obtained structure. An antireflection film 9 is formed on the insulating film 8. According to Japanese Unexamined Patent Publication No. 6-204130, this antireflection film 9 is formed by applying a silicon-based organic material by spin coating. Then, a first positive photoresist film 5A is applied on the antireflection film 9.

Figure 1B:
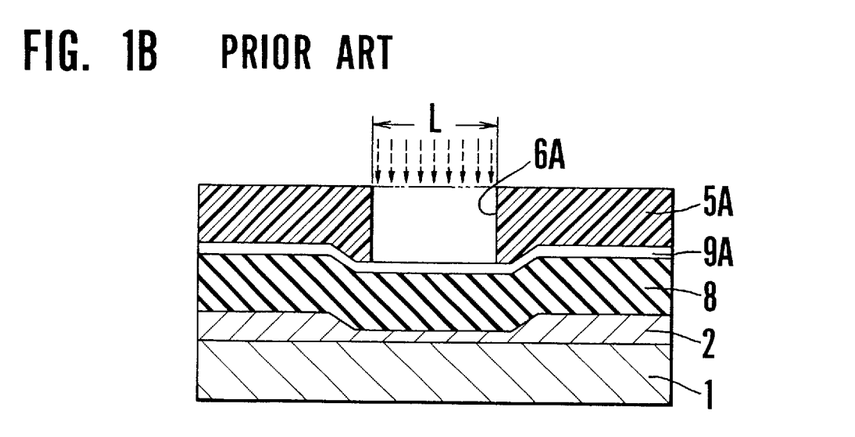

As shown in FIG. 1B, the resultant structure is exposed by an aligner (not shown) using a photomask (not shown). As an exposure beam, an i-line ($\lambda=365$ nm) or a KrF excimer beam ($\lambda=248$ nm) is used. In exposure, an exposure beam passing through the photomask is incident on an exposure region L in the photoresist film 5A. The antireflection film 9 below the photoresist film 5A has a low transmittance with respect to the exposure beam, and is made thick enough to prevent transmission of the incident beam to the under-layer of the antireflection film 9, or reflection thereof to an upper layer. For this reason, a pattern is stably formed without being influenced by reflection or interference of the exposure beam coming from the underlayer. Subsequently, the resultant structure is developed by an alkali developing solution to dissolve the exposure region, forming a resist pattern having a resist opening 6A in the recess step.

Figure 1C:
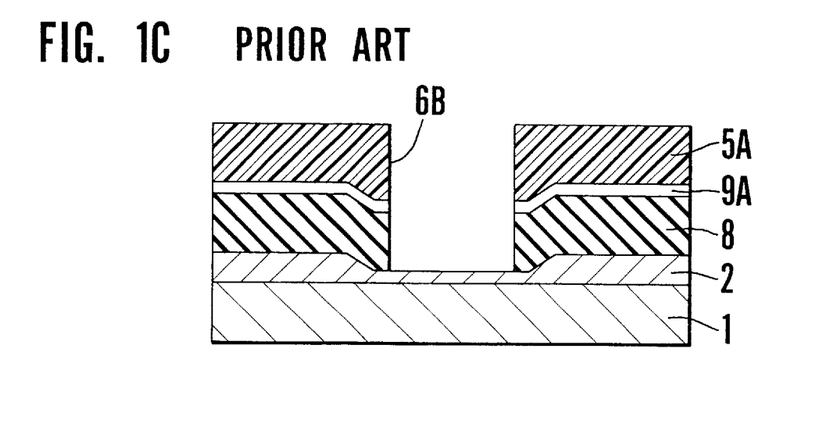

As shown in FIG. 1C, the surface of the antireflection film 9 to be exposed is processed by an oxygen ($O_2$) plasma, and selectively changed into an inorganic-system film 9A to attain the same etching characteristics as those of the $SiO_2$ film 8. Using the first photoresist film 5A as a mask, the inorganic-system film 9A and the $SiO_2$ film 8 are selectively removed by dry etching with $SF_6$ gas, thereby forming an opening portion 6B.

Figure 1D:
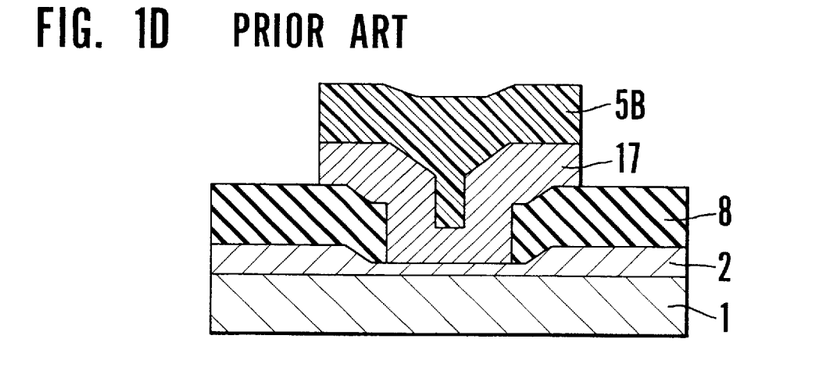

As shown in FIG. 1D, after the remaining photoresist film 5A is removed by an $O_2$ plasma, the remaining antireflection film 9A is completely removed by dry etching using $SF_6$ gas. A metal film 17 is sputtered on the entire surface including the opening portion 6B to fill the gate opening portion 6B. The following steps will be explained using an example disclosed in Japanese Unexamined Patent Publication No. 63-245961. The metal film 17 is made from WSi-Ti-Pt-Au. Using a second photoresist pattern 5B as a mask, an unnecessary portion of the metal film 17 is selectively removed by ion milling.

Figure 1E:
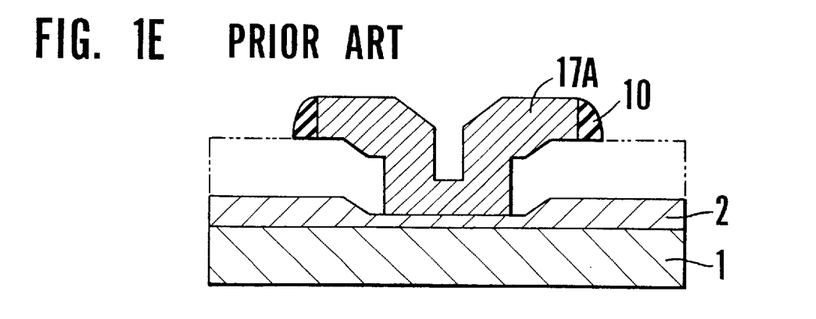

As shown in FIG. 1E, the photoresist pattern 5B is removed to form a gate electrode 17A. An $Si_3N_4$ film 10 is formed by CVD, and then dry-etched using $CF_4$ gas to leave it on only the side walls of the gate electrode 17A. Further, the resultant structure is wet-etched using a solution containing hydrofluoric acid to remove the $SiO_2$ film 8. At this time, the $Si_3N_4$ film 10 serves to protect the Ti layer in the metal film 17 from being etched.

The first problem in the conventional technique is that addition of the antireflection film between the photoresist film and the $SiO_2$ film serving as a target etching film results in an increase in number of steps by the steps of forming, etching, and completely removing the antireflection film, compared to a case of forming no antireflection film.

The step of etching the antireflection film can be performed under the same conditions as those of the step of etching the $SiO_2$ film. However, since the total film thickness which should be etched is larger than that in the case of etching only the $SiO_2$ film, the dimensional accuracy for transferring a resist pattern to the $SiO_2$ film decreases.

The second problem in the conventional technique is that the step of forming and processing the $Si_3N_4$ film is added because a T gate electrode formation metal must be protected by the $Si_3N_4$ film in order to prevent etching of the metal in the step of completely removing the $SiO_2$ film upon forming the T gate electrode.

SUMMARY OF THE INVENTION

The present invention has been made in consideration of the above situation in the prior art, and has as its object to provide a semiconductor manufacturing method in which the step of manufacturing a T gate electrode can be simplified, and the productivity is greatly improved.

To achieve the above object, according to the first aspect of the present invention, there is provided a method of manufacturing a semiconductor device, comprising the steps of sequentially forming an operating layer and a light-shielding film so as to form a recess step on a semiconductor substrate, forming a first photoresist film on the light-shielding film, patterning the light-shielding film using the photoresist film as a mask to form a gate electrode formation opening portion, forming a metal film on an entire surface including the opening portion, selectively etching the metal film using, as a mask, a second photoresist film formed on the metal film, thereby forming a gate electrode having a T shape in a longitudinal section, removing the second photoresist film, and removing the light-shielding film.

According to the second aspect of the present invention, there is provided a method of manufacturing a semiconductor device, wherein the light-shielding film in the first aspect is made from one material selected from the group consisting of Si, TiN, and SiC.

According to the third aspect of the present invention, there is provided a method of manufacturing a semiconductor device, wherein the light-shielding film in the first aspect is made from amorphous carbon.

According to the fourth aspect of the present invention, there is provided a method of manufacturing a semiconductor device, wherein the light-shielding film and the second photoresist film in the third aspect are simultaneously removed.

According to the fifth aspect of the present invention, there is provided a method of manufacturing a semiconductor device, wherein the metal film in the first aspect is made from Al.

As is apparent from the respective aspects, the light-shielding film used in the present invention serves to eliminate unstableness of the pattern dimension and shape caused by reflection at the underlayer in exposing the photoresist film. At the same time, since the metal film is buried in the light-shielding film, this light-shielding film also serves as a mold used in forming an electrode. Therefore, a T gate electrode can be formed by a step simpler than that of the conventional manufacturing method.

By using an electrode formation metal film which is not etched in the step of completely removing the light-shielding film of the present invention, the step of protecting the gate electrode with an $Si_3N_4$ film can be eliminated.

According to the first effect of the present invention, the number of films formed on a semiconductor substrate can be decreased from two layers, i.e., a target etching film and an antireflection film in the prior art to one layer. As a result, the step of forming a film on a semiconductor substrate, and the etching step for a gate opening can be simplified. This is because the light-shielding film made from an Si film or an α-C film formed on the semiconductor substrate serves as both the target etching film for burying a gate electrode metal film and forming a T gate electrode, and the underlying antireflection film used in exposing a photoresist film.

According to the second effect of the present invention, the gate electrode metal film need not be protected by any $Si_3N_4$ film to be prevented from being etched in the step of removing the light-shielding film which has already been unnecessary in forming a T gate electrode. Consequently, the number of steps in forming a T gate electrode can be decreased. This is because, in the first embodiment, an Al film is used as a gate electrode formation metal, so that a gas which etches the Si film without etching the gate electrode can be selected. Also, in the second embodiment, $O_2$ gas used to remove the α-C film does not etch a conventionally used gate electrode formation metal film.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENTS

Several preferred embodiments of the present invention will be described below with reference to the accompanying drawings. FIGS. 2A to 2E are sectional views, respectively, showing the steps in a method of manufacturing a semiconductor device according to the first embodiment of the present invention.

Figure 2A:
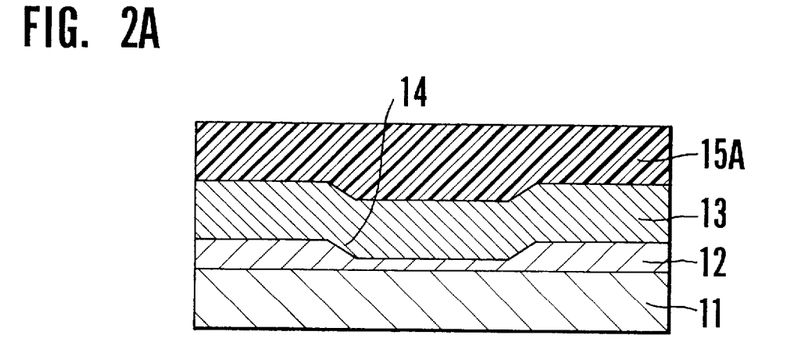
FIGS. 2A to 2E are sectional views, respectively, showing the steps in a method of manufacturing a semiconductor chip according to the first embodiment of the present invention.

As shown in FIG. 2A, after an operating layer 12 made from GaAs is formed by MBE on a semiconductor substrate 11 made from GaAs, the surface of the operating layer 12 is selectively removed by wet etching or dry etching using a photoresist pattern as a mask, thereby forming a recess step 14. An Si film 13 is sputtered as a light-shielding film on the obtained structure. Then, a first positive photoresist film 15A is applied on the entire surface.

Figure 2B:
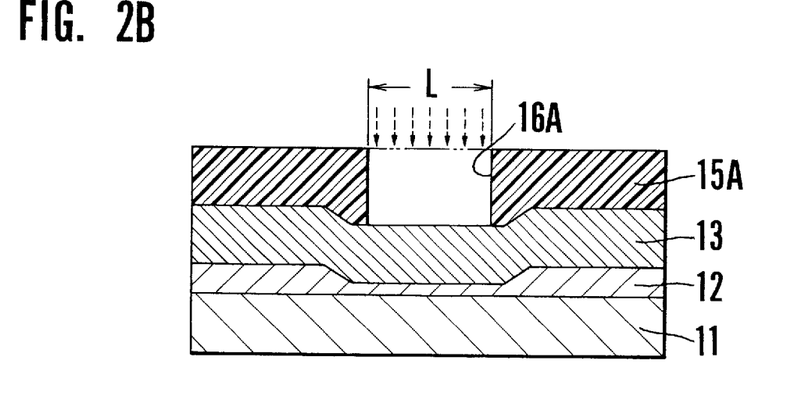

As shown in FIG. 2B, the photoresist film 15A is exposed by an aligner (not shown) using a photomask (not shown). As an exposure beam, an i-line ($\lambda$=365 nm) or a KrF excimer beam ($\lambda$=248 nm) is used. In exposure, an exposure beam passing through the photomask is incident on an exposure region L in the photoresist film 15A. Since the Si film 13 below the photoresist film 15A has a low transmittance with respect to the exposure beam, the exposure beam incident on the Si film 13 is completely absorbed to prevent the exposure beam reflected by the lower surface of the Si film 13 from striking the photoresist film 15A again. Since the Si film 13 has a low reflectivity at the interface with the photoresist film 15A, deformation of a pattern caused by reflection at the underlying step, waving of a pattern side wall due to the presence of a standing wave between incident and reflected beams, and variations in dimension caused upon changes in exposure energy by the multiple reflection effect in a resist film can be prevented. Subsequently, the resultant structure is developed by an alkali developing solution to dissolve the exposure region, forming a resist pattern having a resist opening 16 in the recess step 14.

Figure 2C:
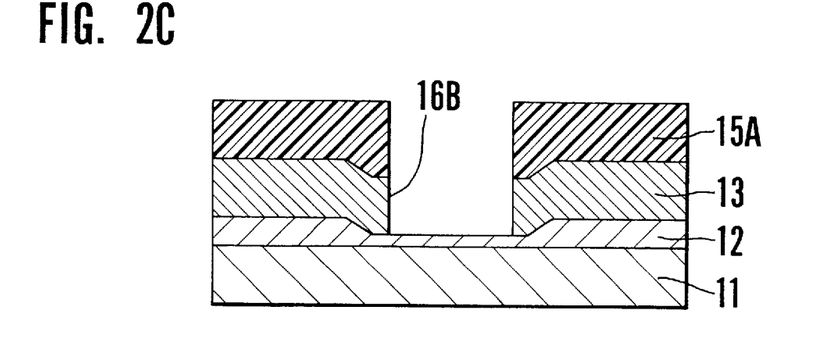

As shown in FIG. 2C, the Si film 13 is selectively removed by dry etching using $SF_6$ gas and the remaining first photoresist film 15A as a mask. A resist opening pattern is transferred to form an opening portion 16B, and then the photoresist film 15A is removed by an $O_2$ plasma.

Figure 2D:
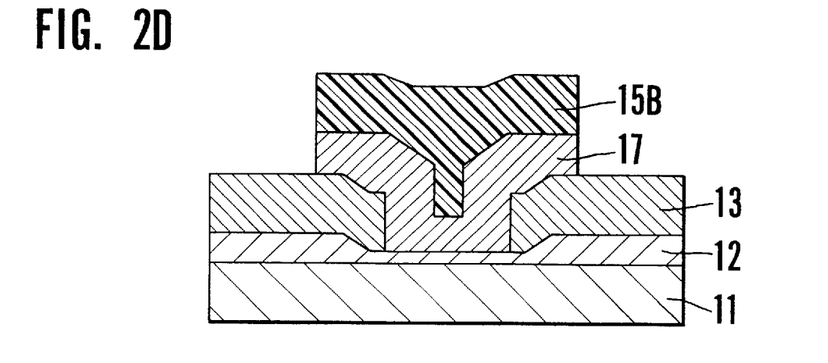

As shown in FIG. 2D, a metal film 17 is formed by, e.g., deposition on the entire surface including the opening portion 16B. At this time, the opening portion 16B is filled with the metal film 17. As this metal film, an Al film 17 or the like is used. Using a second photoresist pattern 15B as a mask, the Al film 17 is selectively removed by dry etching using $CCl_4$ gas or $BCl_4$ gas to form a gate electrode 17A having a substantially T shape. Thereafter, the photoresist film 15B is removed using an $O_2$ plasma.

Figure 2E:
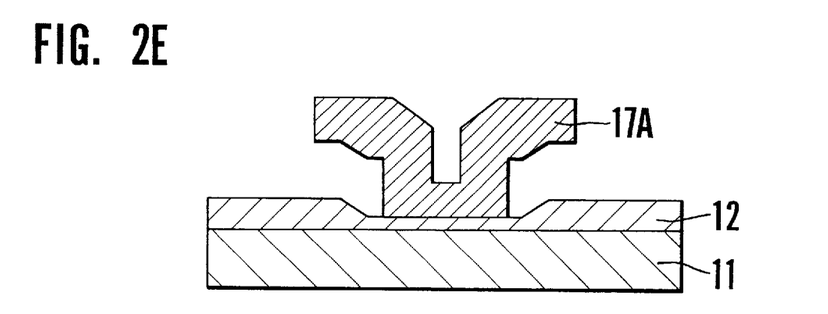

As shown in FIG. 2E, the Si film 13 including the periphery of the gate electrode 17A is completely removed by isotropic dry etching using $SF_6$ gas. At this time, the gate electrode 17A made from Al is not etched by the $SF_6$ gas, and forms a Schottky junction with the operating layer 12.

Although this embodiment has exemplified the case using the Si film as an antireflection film, a TiN film and an SiC film can also be used. The etching gas in this case is $SF_6$ gas or $CHF_3$ gas.

FIGS. 3A to 3E are sectional views, respectively, for explaining a method of manufacturing a semiconductor device according to the second embodiment of the present invention.

Figure 3A:
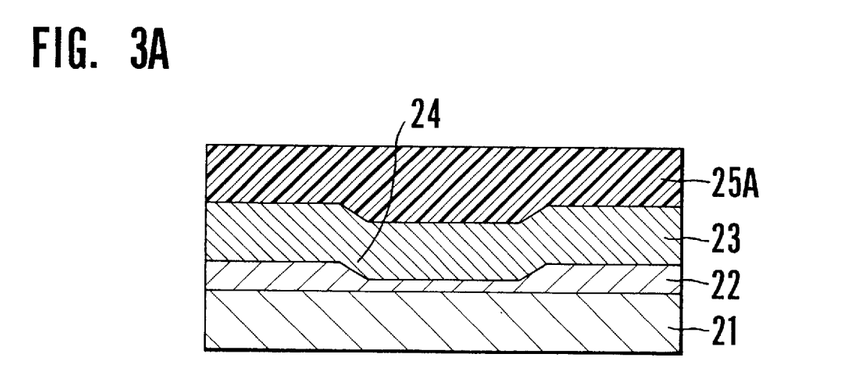
FIGS. 3A to 3E are sectional views, respectively, showing the steps in a method of manufacturing a semiconductor chip according to the second embodiment of the present invention.

With the same processing as in the first embodiment, after an operating layer 22 is formed on a semiconductor substrate 21, the surface of the operating layer 22 is selectively removed by wet etching or dry etching using a photoresist pattern as a mask to form a recess step 24, as shown in FIG. 3A. An amorphous carbon film (to be referred to as an α-C film hereinafter) 23 is sputtered on the operating layer 22, and a first positive photoresist film 25A is applied.

Figure 3B:
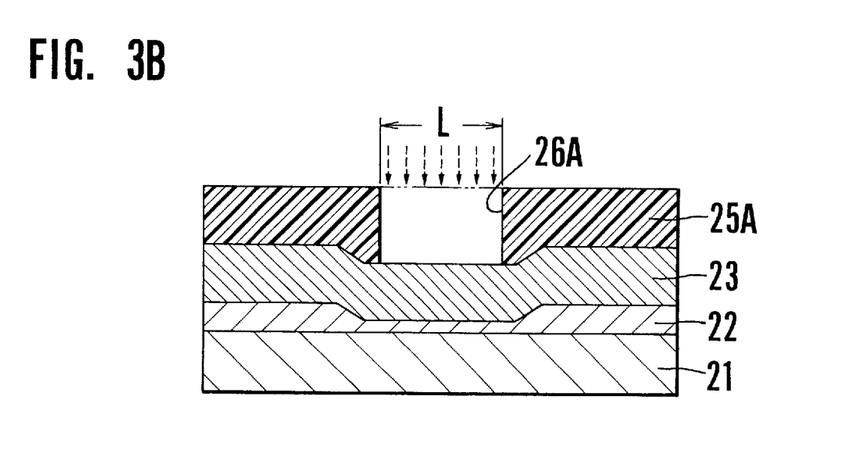

As shown in FIG. 3B, the obtained structure is exposed by an aligner (not shown) using a photomask (not shown). As an exposure beam, an i-line ($\lambda$=365 nm) or a KrF excimer beam ($\lambda$=248 nm) is used. In exposure, an exposure beam passing through the photomask is incident on an exposure region L in the first photoresist film 25A. Since the α-C film 23 below the first photoresist film 25A has a low transmittance with respect to the exposure beam, the exposure beam incident on the α-C film 23 is completely absorbed to be prevented from impinging on the first photoresist film 25A again. Since the α-C film 23 has a low reflectivity at the interface with the first photoresist film 25A, deformation of a pattern caused by reflection at the underlayer stage, waving of a pattern side wall due to the presence of a standing wave between incident and reflected beams, and variations in dimension caused upon changes in exposure energy by the multiple reflection effect in a resist film can be prevented. Subsequently, the resultant structure is developed by an alkali developing solution to dissolve the exposure region, forming a resist pattern having a resist opening 26A in the recess step 24.

Figure 3C:
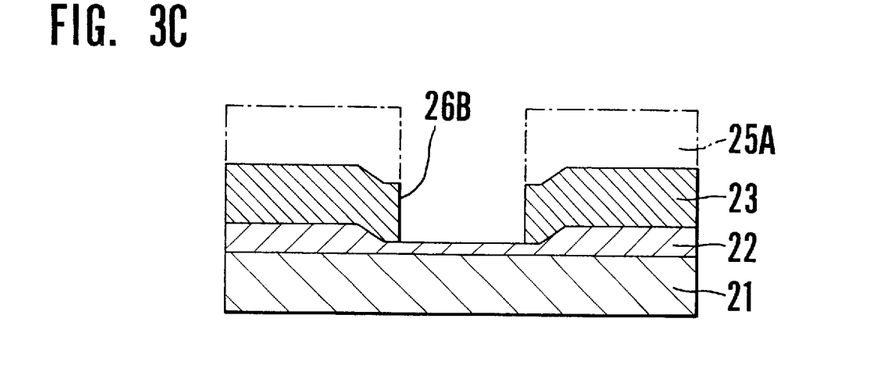

As shown in FIG. 3C, the α-C film 23 is selectively removed by dry etching using $O_2$ gas and the remaining first photoresist film 25A as a mask, and a resist opening pattern is transferred to form an opening portion 26B. At the same time, the first photoresist film 25A is also etched and removed.

Figure 3D:
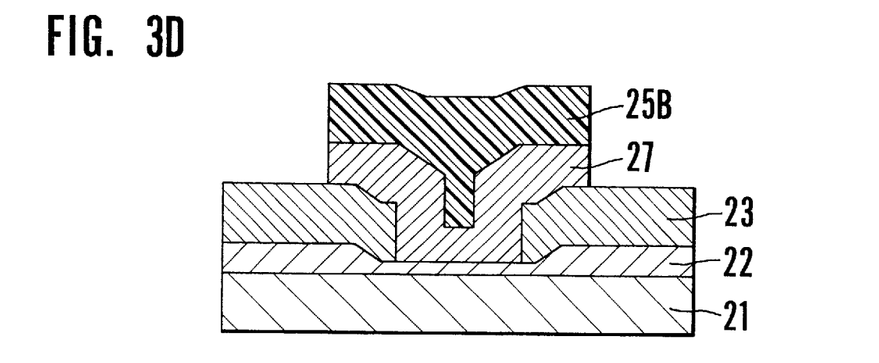

As shown in FIG. 3D, a metal film 27 is formed by, e.g., deposition on the entire surface including the opening portion 26B. At this time, the opening portion 26B is filled with the metal film 27. As this metal film, an Al film 27 or the like is used. Using the pattern of a second photoresist film 25B as a mask, the Al film 27 is selectively removed by dry etching using $CCl_4$ gas or $BCl_4$ gas to form a gate electrode 27A having a substantially T shape.

Figure 3E:
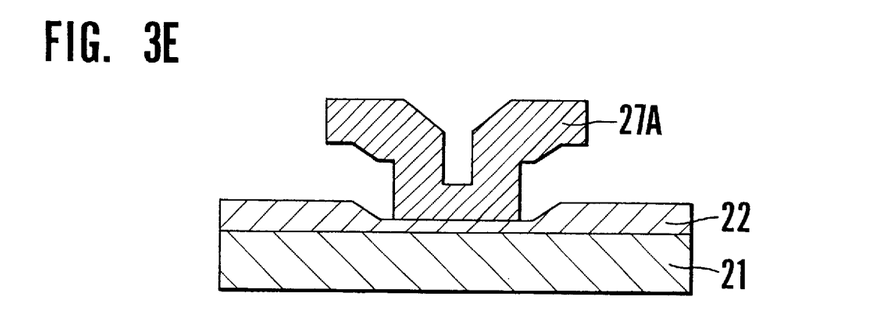

As shown in FIG. 3E, the second photoresist film 25B, and the α-C film 23 including the periphery of the gate electrode 27A are completely removed by isotropic dry etching using $O_2$ gas. At this time, the gate electrode 27A made from Al is not etched by the $O_2$ gas, and forms a Schottky junction with the operating layer 22. In this manner, according to the second embodiment, since the α-C film 23 and the second photoresist film 25B can be simultaneously etched, the process can be simplified more than the first embodiment.

Although the Al film is used as a gate electrode in the above embodiments, a WSi film or an Mo film can be used. The etching gas in this case is $SF_6$ gas.

What I claim is:

1. A method of manufacturing a semiconductor device, comprising the steps of: sequentially forming an operating layer and a light-shielding film so as to form a recess step on a semiconductor substrate; forming a first photoresist film on said light-shielding film; patterning said light-shielding film using said photoresist film as a mask to form a gate electrode formation opening portion that serves as a mold used in forming the gate electrode; forming a metal film on an entire surface including the opening portion; selectively etching said metal film using, as a mask, a second photoresist film formed on said metal film, thereby forming a gate electrode having a T shape in a longitudinal section; removing said second photoresist film; and removing said light-shielding film.

2. A method according to claim 1, wherein said light-shielding film is made from one material selected from the group consisting of Si, TiN, and SiC.

3. A method according to claim 1, wherein said light-shielding film is made from amorphous carbon.

4. A method according to claim 3, wherein said light-shielding film and said second photoresist film are simultaneously removed.

5. A method according to claim 1, wherein said metal film is made from Al.

6. A method of manufacturing a semiconductor device, comprising:
    (a) forming an operating layer on a substrate;
    (b) forming a shielding film on the operating layer;
    (c) forming a photoresist on the shielding film;
    (d) providing a patterned photoresist by selectively exposing the photoresist to a beam that is substantially absorbed by the shielding film; and
    (e) etching the shielding film using the patterned photoresist as a mask, wherein a portion of the shielding film that remains after etching serves as a mold for forming an electrode that connects to a portion of the operating layer exposed by etching.

7. A method, according to claim 6, wherein forming the operating layer includes providing a recess step.

8. A method according to claim 7, wherein the recess step is provided by etching the operating layer.

9. A method, according to claim 7, wherein patterning the photoresist includes providing an opening in the photoresist for a gate electrode.

10. A method, according to claim 9, further comprising:
    (f) removing the patterned photoresist;
    (g) selectively forming the gate electrode in the opening and on a portion of the shielding film disposed about the opening; and
    (h) removing the shielding film.

11. A method, according to claim 10, wherein forming the gate electrode includes sputtering metal.

12. A method, according to claim 11, wherein forming the operating layer includes using molecular beam epitaxy.

13. A method, according to claim 12, wherein forming the shielding film includes sputtering one of: Si, TiN, SiC, and amorphous carbon.

14. A method, according to claim 13, wherein patterning the photoresist includes using one of: an i-line beam ($\lambda$=365 nm) and a KrF excimer beam ($\lambda$=248 nm).

15. A method, according to claim 14, wherein etching the shielding film includes dry etching using one of: $SF_6$ gas and $CHF_3$ gas.

16. A method, according to claim 15, wherein removing the patterned photoresist includes using an $O_2$ plasma.

17. A method of manufacturing a T electrode in a field effect transistor, comprising:
    (a) forming, on a substrate, an operating layer with a recess;
    (b) forming a shielding layer on the operating layer;
    (c) forming a patterned photoresist on the shielding layer using a beam that is substantially absorbed by the shielding layer;
    (d) providing an opening in the shielding layer by etching the shielding layer using the patterned photoresist, wherein the opening serves as a mold for forming an electrode that connects to a portion of the operating layer corresponding to the opening;
    (e) removing the patterned photoresist;
    (f) providing the electrode that connects to the portion of the operating layer corresponding to the opening by providing a metal coating in the opening and on the shielding layer;

(g) selectively etching portions of the metal coating that are disposed distally from the opening; and (h) removing the shielding layer.

18. A method, according to claim 17, wherein forming the patterned photoresist includes using one of: an i-line beam ($\lambda$=365 nm) and a KrF excimer beam ($\lambda$=248 nm).

19. A method, according to claim 17, wherein providing the metal coating includes sputtering metal on to the shielding layer and the opening.

20. A method, according to claim 17, wherein forming the shielding layer includes sputtering one of: Si, TiN, SiC, and amorphous carbon.

* * * * *